(12) United States Patent
Kobayashi

(10) Patent No.: US 10,754,246 B2
(45) Date of Patent: Aug. 25, 2020

(54) SLIDING INHIBITION PORTION EXTRACTING METHOD, PATTERN FORMING METHOD, AND SEMICONDUCTOR DEVICE MANUFACTURING METHOD

(71) Applicant: TOSHIBA MEMORY CORPORATION, Tokyo (JP)

(72) Inventor: Sachiko Kobayashi, Ota Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/298,049

(22) Filed: Mar. 11, 2019

(65) Prior Publication Data

US 2020/0089106 A1    Mar. 19, 2020

(30) Foreign Application Priority Data

Sep. 18, 2018 (JP) ................ 2018-173296

(51) Int. Cl.
| | | |
|---|---|---|
| *G03F 7/00* | (2006.01) | |
| *G03F 7/20* | (2006.01) | |
| *H01L 21/027* | (2006.01) | |
| *G03F 9/00* | (2006.01) | |

(52) U.S. Cl.
CPC ........ *G03F 7/0002* (2013.01); *G03F 7/70633* (2013.01); *G03F 9/7042* (2013.01); *H01L 21/0274* (2013.01)

(58) Field of Classification Search
None
See application file for complete search history.

(56) References Cited

U.S. PATENT DOCUMENTS

| | | |
|---|---|---|
| 9,952,505 B2 | 4/2018 | Okamoto et al. |
| 9,971,342 B2 | 5/2018 | Shimizu et al. |
| 9,993,962 B2 | 6/2018 | Cherala |
| | (Continued) | |

FOREIGN PATENT DOCUMENTS

| | | |
|---|---|---|
| JP | 2014-241398 A | 12/2014 |
| JP | 2016-21441 A | 2/2016 |
| | (Continued) | |

*Primary Examiner* — Asok K Sarkar
(74) *Attorney, Agent, or Firm* — Finnegan, Henderson, Farabow, Garrett & Dunner, L.L.P.

(57) ABSTRACT

According to one embodiment, a sliding inhibition portion extracting method is applied to pattern formation to press an original having a pattern against a resin on a transferred object and cure the resin to transfer the pattern of the original, and extracts a sliding inhibition portion that inhibits sliding of the original in a state of being in contact with the resin before curing in a shot region that is a region in which the pattern is formed by single transfer by either a first technique of estimating the sliding inhibition portion on the basis of at least one of an uneven distribution on a surface of the transferred object, a pattern layout of the original, and a result of misalignment of a transfer pattern, changing a thickness of the resin in the shot region on the basis of the estimation, and determining whether sliding inhibition of the original occurs, or a second technique using a table indicating a relationship between a distribution of the sliding inhibition portion in the shot region and the misalignment of a transfer pattern.

20 Claims, 14 Drawing Sheets

(56) References Cited

U.S. PATENT DOCUMENTS

2014/0339721 A1  11/2014  Toshima et al.
2016/0009021 A1   1/2016  Okada et al.
2020/0073233 A1*  3/2020  Hatano ............... H01L 21/0274

FOREIGN PATENT DOCUMENTS

| JP | 2016-58735 A | 4/2016 |
| JP | 2017-212439 A | 11/2017 |
| JP | 6279433 B2 | 2/2018 |
| JP | 6302287 B2 | 3/2018 |

* cited by examiner

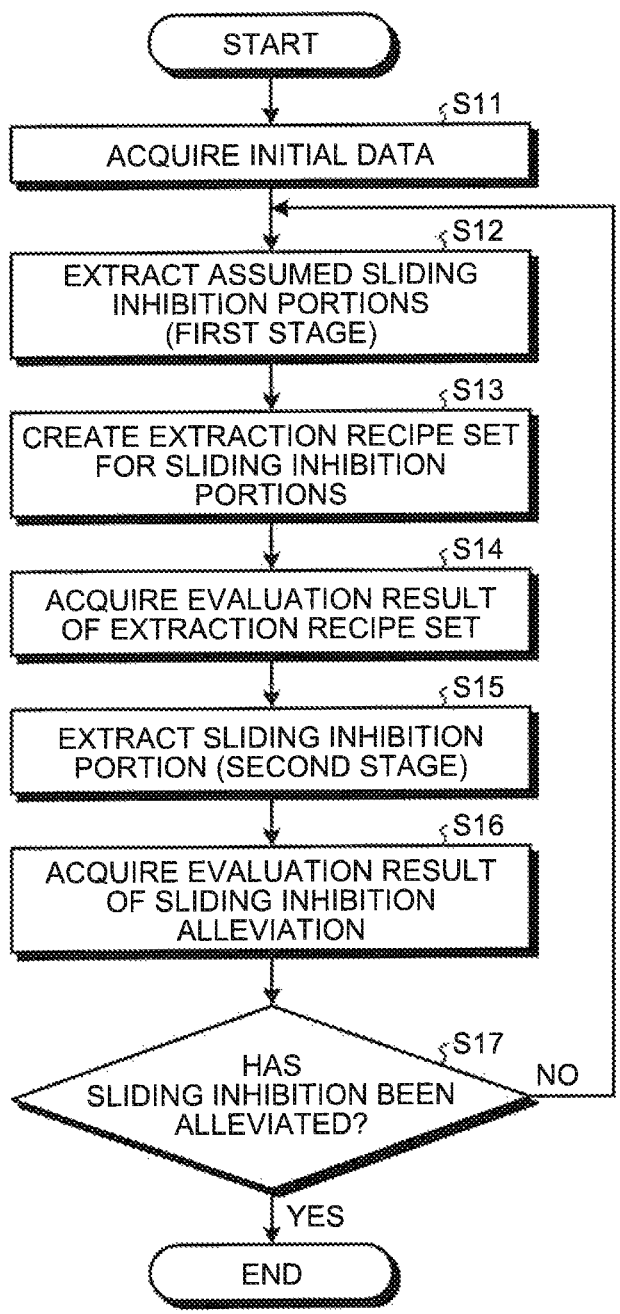

FIG.10
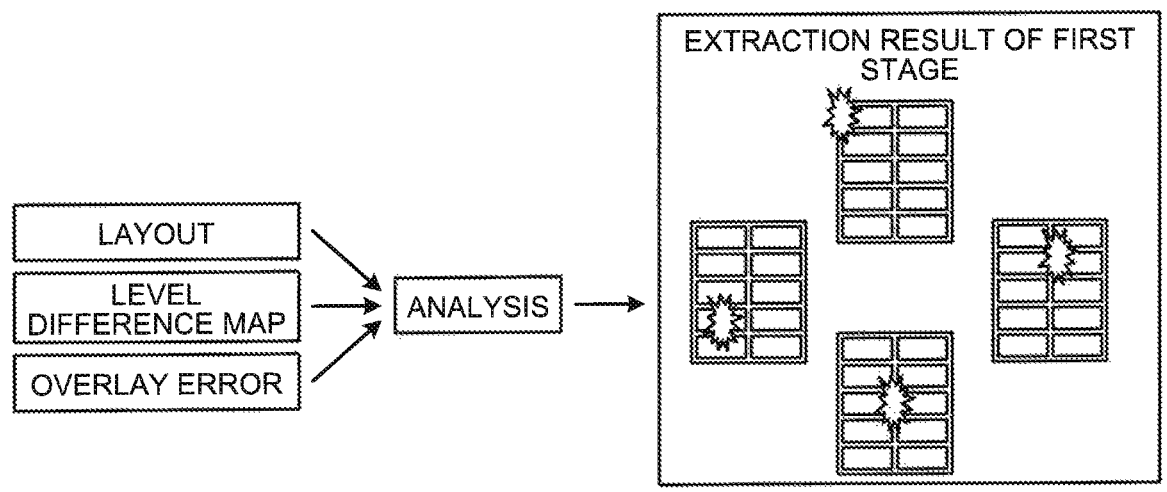
FIG.11A
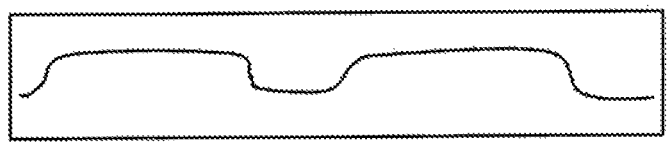
FIG.11C
FIG.11B
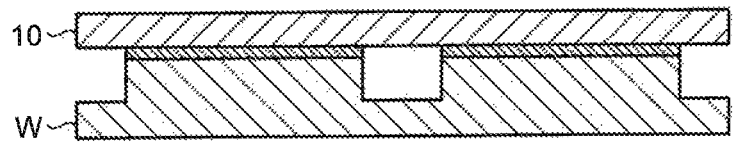
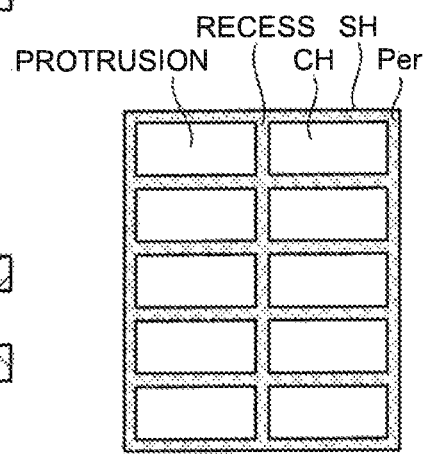

FIG.19A1
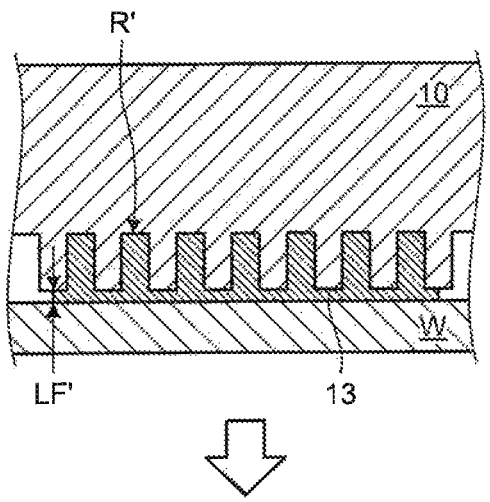
FIG.19A2
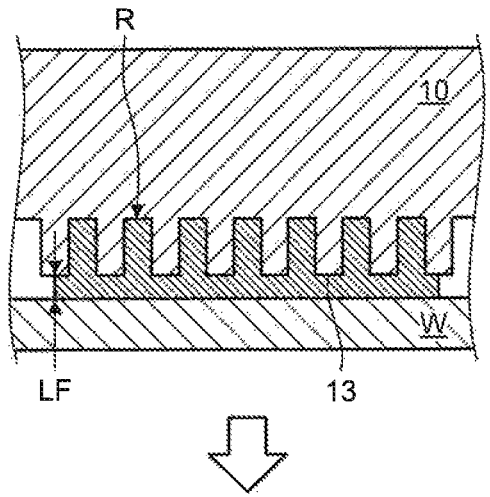
FIG.19B1
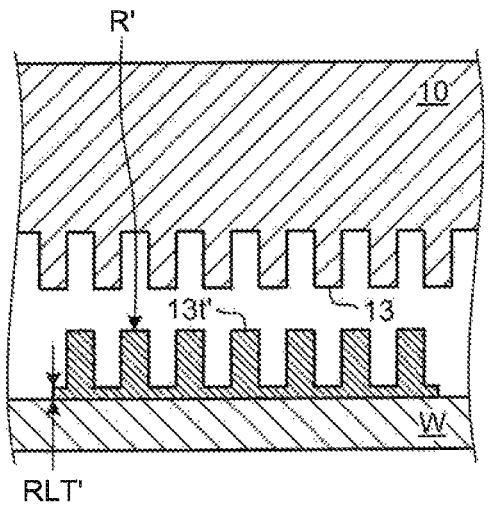
FIG.19B2
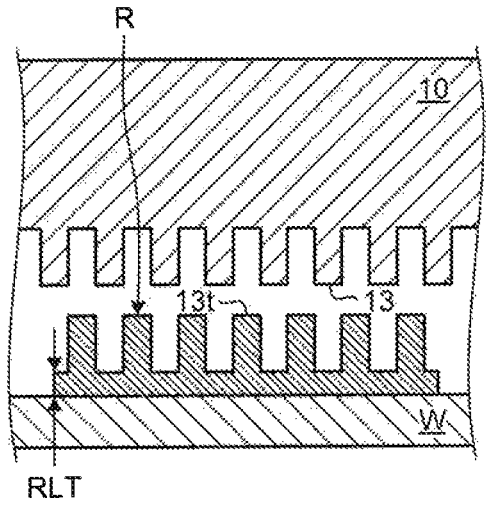

SLIDING INHIBITION PORTION EXTRACTING METHOD, PATTERN FORMING METHOD, AND SEMICONDUCTOR DEVICE MANUFACTURING METHOD

CROSS-REFERENCE TO RELATED APPLICATIONS

This application is based upon and claims the benefit of priority from Japanese Patent Application No. 2018-173296, filed on Sep. 18, 2018; the entire contents of which are incorporated herein by reference.

FIELD

Embodiments described herein relate generally to a sliding inhibition portion extracting method, a pattern forming method, and a semiconductor device manufacturing method.

BACKGROUND

As a method of forming a fine pattern on a transferred object, a technique of pressing an original against a resin on the transferred object and curing the resin to transfer the fine pattern of the original has been proposed. In transferring the fine pattern, alignment is performed by sliding the original in a state of being in contact with the resin before curing.

BRIEF DESCRIPTION OF THE DRAWINGS

FIG. 9 is a flowchart illustrating an example of a procedure of sliding inhibition portion extracting processing by the sliding inhibition portion extraction apparatus according to the first embodiment;

FIG. 10 is a block diagram illustrating a process of deriving an extraction result of a first stage by a sliding inhibition portion extraction apparatus according to a modification of the first embodiment;

FIG. 11A is a schematic diagram illustrating a relationship between a level difference map and sliding inhibition used in the sliding inhibition portion extraction apparatus according to the modification of the first embodiment;

FIG. 11B is a schematic diagram illustrating the relationship between a level difference map and sliding inhibition used in the sliding inhibition portion extraction apparatus according to the modification of the first embodiment;

FIG. 11C is a schematic diagram illustrating the relationship between a level difference map and sliding inhibition used in the sliding inhibition portion extraction apparatus according to the modification of the first embodiment;

FIG. 19A1 is a schematic diagram for describing an influence of the first alleviating technique of sliding inhibition according to the third embodiment on a residual layer thickness of a resist;

FIG. 19A2 is a schematic diagram for describing an influence of the first alleviating technique of sliding inhibition according to the third embodiment, on a residual layer thickness of the resist;

FIG. 19B1 is a schematic diagram for describing the influence of the first, alleviating technique of sliding inhibition according to the third embodiment on a residual layer thickness of the resist;

FIG. 19B2 is a schematic diagram for describing the influence of the first, alleviating technique of sliding inhibition according to the third embodiment on a residual layer thickness of the resist;

DETAILED DESCRIPTION

In general, according to one embodiment, a sliding inhibition portion extracting method is applied to pattern formation to press an original having a pattern against a resin on a transferred object and cure the resin to transfer the pattern of the original, and extracts a sliding inhibition portion that inhibits sliding of the original in a state of being in contact with the resin before curing in a shot region that is a region in which the pattern is formed by single transfer by either a first technique, of estimating the sliding inhibition portion on the basis of at least one of an uneven distribution on a surface of the transferred object, a pattern layout of the original, and a result of misalignment of a transfer pattern, changing a thickness of the resin in the shot region on the basis of the estimation, and determining whether sliding inhibition of the original occurs, or a second technique using a table indicating a relationship between a distribution of the sliding inhibition portion in the shot region and the misalignment of a transfer pattern.

Hereinafter, exemplary embodiments of the present invention will be described in detail with reference to the drawings. Note that the present invention is not limited to the following embodiments. Further, constituent, elements in the following embodiments include those easily assumed by a person skilled in the art or those substantially the same.

First Embodiment

A first embodiment will be described with reference to FIGS. 1 to 12C. In the first embodiment, a semiconductor device manufacturing process by an imprint method will be exemplified as an imprinting manufacturing process to transfer a fine pattern on a transferred object.

(Example of Imprint Processing)

Figure 1:
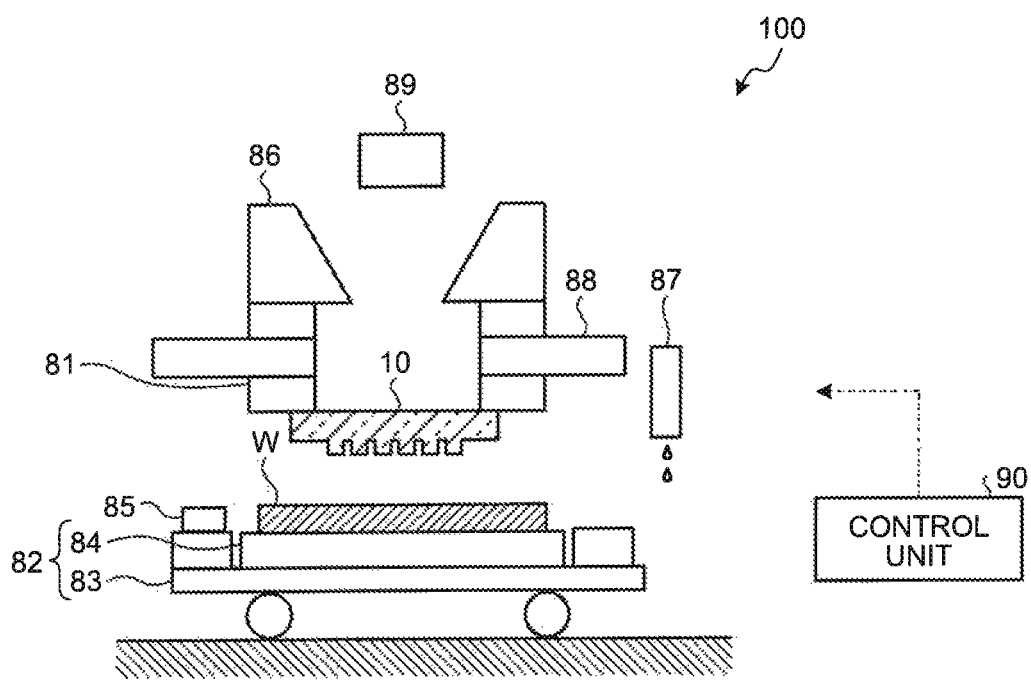
FIG. 1 is a diagram illustrating a configuration example of an imprint apparatus according to a first embodiment.

First, an example of imprint processing in an imprint apparatus 100 will be described with reference to FIG. 1 and FIGS. 2A to 2E. FIG. 1 is a diagram illustrating a configuration example of the imprint apparatus 100 according to the first embodiment.

As illustrated in FIG. 1, the imprint apparatus 100 includes a template stage 31, a placing table 82, a reference mark 85, an alignment sensor 86, a liquid dropping device 87, a stage base 88, a light source 89, and a control unit 90. In the imprint apparatus 100, a template 10 is installed.

The placing table 82 includes a wafer chuck 84 and a main body 83. The wafer chuck 84 fixes a wafer W as a semiconductor substrate that is a transferred object at a predetermined position on the main body 83. The reference mark 85 is provided on the placing table 82. The reference mark 85 is used for alignment when loading the wafer W onto the placing table 82.

The placing table 82 allows the wafer W to be placed thereon and moves in a plane (in a horizontal plane) parallel to the placed wafer W. The placing table 82 moves the wafer W toward below the liquid dropping device 87 when a resist is dropped on the wafer W, and moves the wafer W toward below the template 10 when transfer processing on the wafer W is performed.

The stage base 83 supports the template 10 by the template stage 81, and moves in an up-down direction (vertical direction) and presses a fine pattern 13 of the template 10 against the resist on the wafer W. The alignment sensor 86 is provided on the stage base 88. The alignment sensor 86 is a sensor that detects the position of the wafer W and the position of the template 10.

The liquid dropping device 87 is a device that drops the resist onto the wafer W by an inkjet method. An inkjet head provided in the liquid dropping device 87 has a plurality of fine holes through which droplets of the resist are ejected, and drops the droplets of the resist onto the wafer W.

Here, the resist is a resin-based mask material, and examples include a photo-curable resin cured by irradiation with light and a thermosetting resin cured by heat application. Here, the photo-curable resin is used for the resist.

The light source 89 is, for example, a device that irradiates the resist on the wafer W with ultraviolet rays, and is provided above the stage base 88. The light source 89 irradiates the resist with light from above the template 10 in a state where the template 10 is pressed against the resist.

The control unit 90 controls the template stage 81, the placing table 82, the reference mark 85, the alignment sensor 86, the liquid dropping device 87, the stage base 88, and the light source 89.

FIGS. 2A to 2E are flow diagrams illustrating an example of a procedure of imprint processing by the imprint apparatus 100 according to the first embodiment.

First, the wafer W on which a film to be processed Ox is formed is placed on the placing table 82, and the placing table 82 is moved to below the liquid dropping device 87.

Figure 2A:
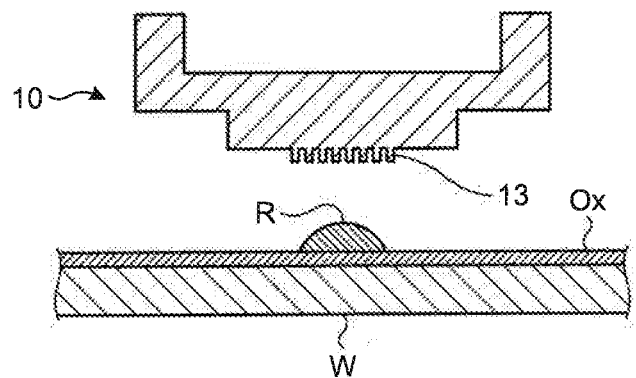
FIGS. 2A to 2E are flow diagrams illustrating an example of a procedure of imprint processing by the imprint apparatus according to the first embodiment.

As illustrated in FIG. 2A, a single droplet or a plurality of droplets of a resist R is dropped onto the film to be processed Ox from the liquid dropping device 87. Thereafter, the placing table 82 is moved to below the template 10.

Figure 2B:
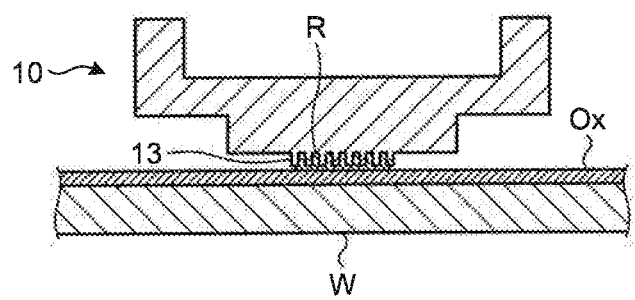

As illustrated in FIG. 2B, the template stage 81 is moved downward, and the fine pattern 13 formed on the template 10 is pressed against the resist R while alignment is performed with the alignment sensor 86. Next, the resist R is irradiated with light by the light source 89 of the imprint apparatus 100 and is cured in a state where the template 10 is pressed against the resist R.

Figure 2C:
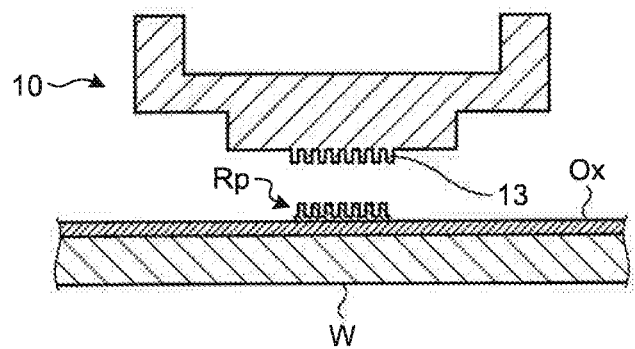

As illustrated in FIG. 2C, the template 10 is released. Thereby, a resist pattern Rp to which the fine pattern 13 has been transferred is formed on the film to be processed Ox of the wafer W.

Figure 2D:
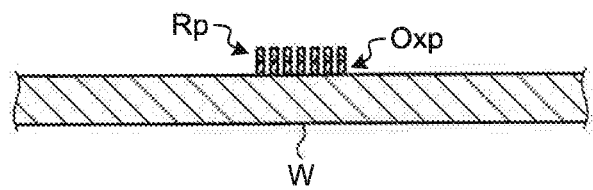

As illustrated in FIG. 2D, the film to be processed Ox is processed using the resist pattern Rp to which the fine pattern 13 has been transferred as a mask. Thereby, a processed film pattern Oxp is formed.

Figure 2E:
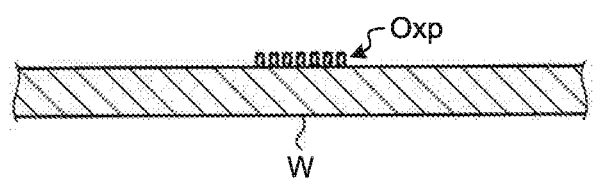

As illustrated in FIG. 2E, the resist pattern Rp is peeled off by ashing or the like and the processed film pattern Oxp formed on the wafer W is obtained. Thereafter, the above processing is repeated to form a plurality of the processed film patterns on the wafer W, whereby a semiconductor device is manufactured.

Figure 3:
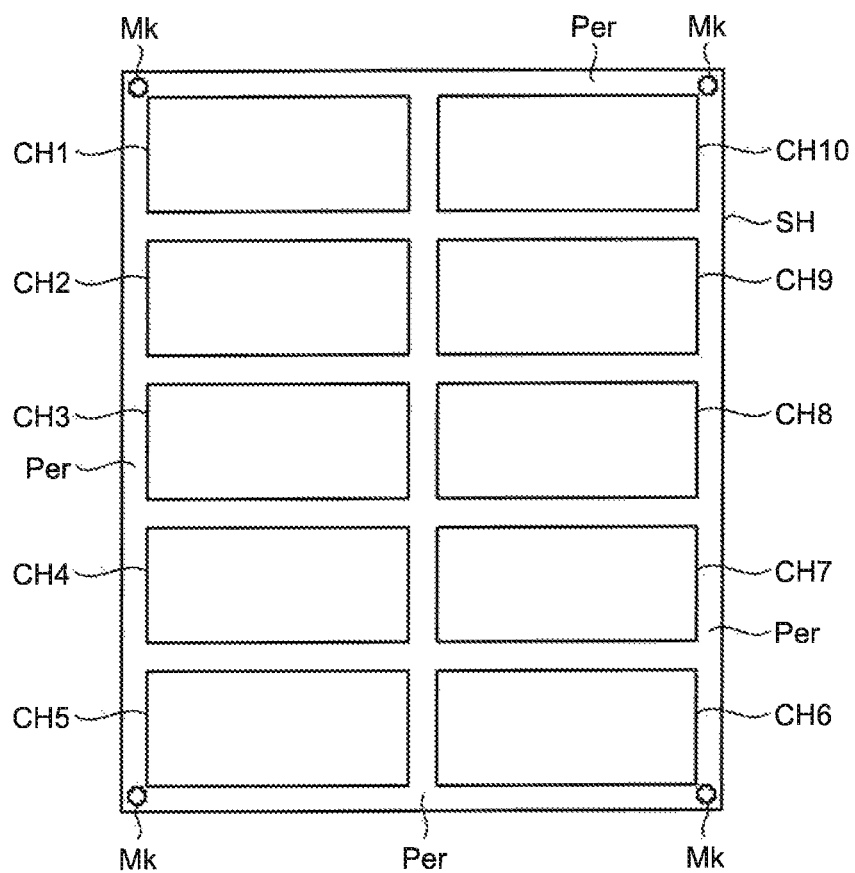
FIG. 3 is a diagram illustrating an example of a shot region formed on a wafer in the imprint processing according to the first embodiment.

In the imprint processing as described above, single imprinting of the template 10 is performed for one shot region on the wafer W to form a pattern. FIG. 3 is a diagram illustrating an example of a shot region SH formed on the wafer W in the imprint, processing according to the first embodiment.

As illustrated in FIG. 3, the shot region SH has a plurality of chip regions CH1 to CH10. The chip regions CH1 to CH10 are regions to which the fine pattern 13 of the template 10 is transferred. In the example of FIG. 3, the ten chip regions CH1 to CH10 are illustrated, but the number and arrangement of the chip regions CH are not limited to the example.

The chip regions CH1 to CH10 are separated by a peripheral region Per. The peripheral region Per is also called kerf region, and is a region to be cut when a manufactured semiconductor device is cut into chips.

One or more alignment marks Mk serving as references when the wafer W and the template 10 are aligned may be arranged in the peripheral region Per. In the example of FIG. 3, the alignment marks Mk are respectively arranged at four corners of the shot region SH, but the number and arrangement of the alignment marks Mk are not limited to the example.

The alignment between the wafer W and the template 10 will be described in more detail.

Figure 4:
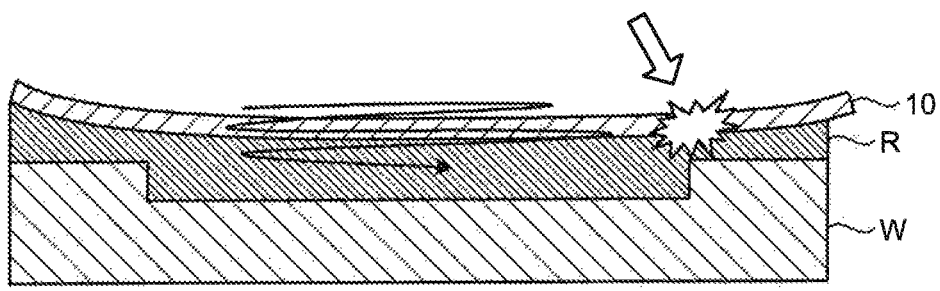
FIG. 4 is a schematic diagram for describing alignment between a wafer and a template in the imprint processing according to the first embodiment.

FIG. 4 is a schematic diagram for describing alignment between the wafer W and the template 10 in the imprint processing according to the first embodiment. As illustrated in FIG. 4, the alignment between the wafer W and the template 10 is performed in a state where the template 10 is in contact with the resist R on the wafer W, for example.

The resist R dropped onto the wafer W expands and spreads as a liquid film having fluidity when the template 10 is pressed against the resist R. The template 10 is aligned with the wafer W with reference to the alignment marks Mk (see FIG. 3) of the template 10 while sliding the template 10 on the liquid film. The zigzag arrow in FIG. 4 illustrates a state of sliding the template 10.

In the case where the object to be transferred is a wafer W that has undergone various processes, unevenness due to a stacked structure may be formed on the wafer W in some cases. The liquid film of the resist R becomes thin in a recess or at a corner between a protrusion and the recess and a shearing force between the wafer W and the template 10 increases, so that sliding of the template 10 may be inhibited in some cases as if the template 10 is fixed to the wafer W.

When sliding inhibition of the template 10 occurs, the alignment between the wafer W and the template 10 cannot be sufficiently performed, and misalignment (an overlay error) in which the position of a transfer pattern on the wafer W is misaligned may occur. If the template 10 is forcibly moved while the sliding of the template 10 is inhibited, the template 10 may be deformed and the overlay error may occur. Furthermore, the template 10 may be damaged.

To avoid occurrence of these problems, it is important to identify a slicing inhibition portion on the wafer W and to take countermeasures. Therefore, a technology of specifying the sliding inhibition portion on the wafer W will be described below.

(Configuration Example of Sliding Inhibition Portion Extraction Apparatus)

Figure 5:
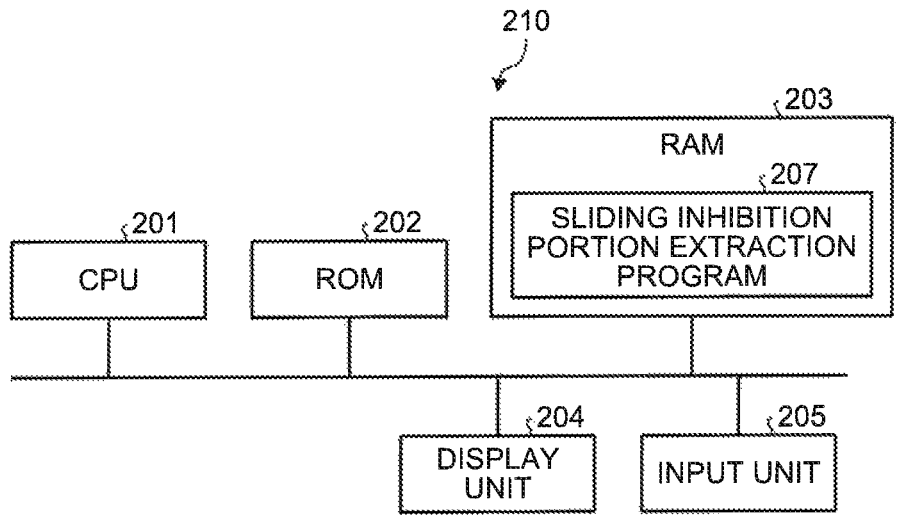
FIG. 5 is a block diagram illustrating an example of a hardware configuration of a sliding inhibition portion extraction apparatus according to the first, embodiment.

FIG. 5 is a block diagram illustrating an example of a hardware configuration of a sliding inhibition portion extraction apparatus 210 according to the first embodiment.

As illustrated in rig. 5, the sliding inhibition portion extraction apparatus 210 includes a central processing unit (CPU) 201, a read only memory (ROM) 202, a random access memory (RAM) 203, a display unit 204, and an input unit 205. In the sliding inhibition portion extraction apparatus 210, the CPU 201, the ROM 202, the RAM 203, the display unit 204, and the input unit 205 are connected via a bus line.

The CPU 201 extracts the sliding inhibition portion on the wafer W using a sliding inhibition portion extraction program 207 that is a computer program. The sliding inhibition portion extraction program 207 is a computer program product executable by a computer and having a computer readable recording medium including a plurality of instructions for extracting the sliding inhibition portion. In the sliding inhibition portion extraction program 207, the plurality of instructions causes the computer to execute processing of extracting the sliding inhibition portion.

The display unit 204 is a display device such as a liquid crystal monitor, and displays the sliding inhibition portion on the wafer W and the like on the basis of an instruction from the CPU 201. The input unit 205 includes a mouse and a keyboard, and inputs instruction information externally input by a user (such as parameters necessary for extracting the sliding inhibition portion). The instruction information input to the input unit 205 is sent to the CPU 201.

The sliding inhibition portion extraction program 207 is stored in the ROM 202 and is loaded into the RAM 203 via the bus line. FIG. 5 illustrates a state where the sliding inhibition portion extraction program 207 is loaded in the RAM 203.

The CPU 201 executes the sliding inhibition portion extraction program 207 loaded in the RAM 203. Specifically, in the sliding inhibition portion extraction apparatus 210, the CPU 201 reads the sliding inhibition portion extraction program 207 from the ROM 202, expands the program 207 in a program storage region in the PAM 203, and executes various types of processing according to an instruction input from the input unit 205 by the user. The CPU 201 temporarily stores various data generated during the various types of processing in a data storage region formed in the RAM 203.

The sliding inhibition portion extraction program 207 executed by the sliding inhibition portion extraction apparatus 210 has a module configuration including a calculation unit, a determination unit, and the like to be described below, and these units are leaded and generated on a main storage device.

Figure 6:
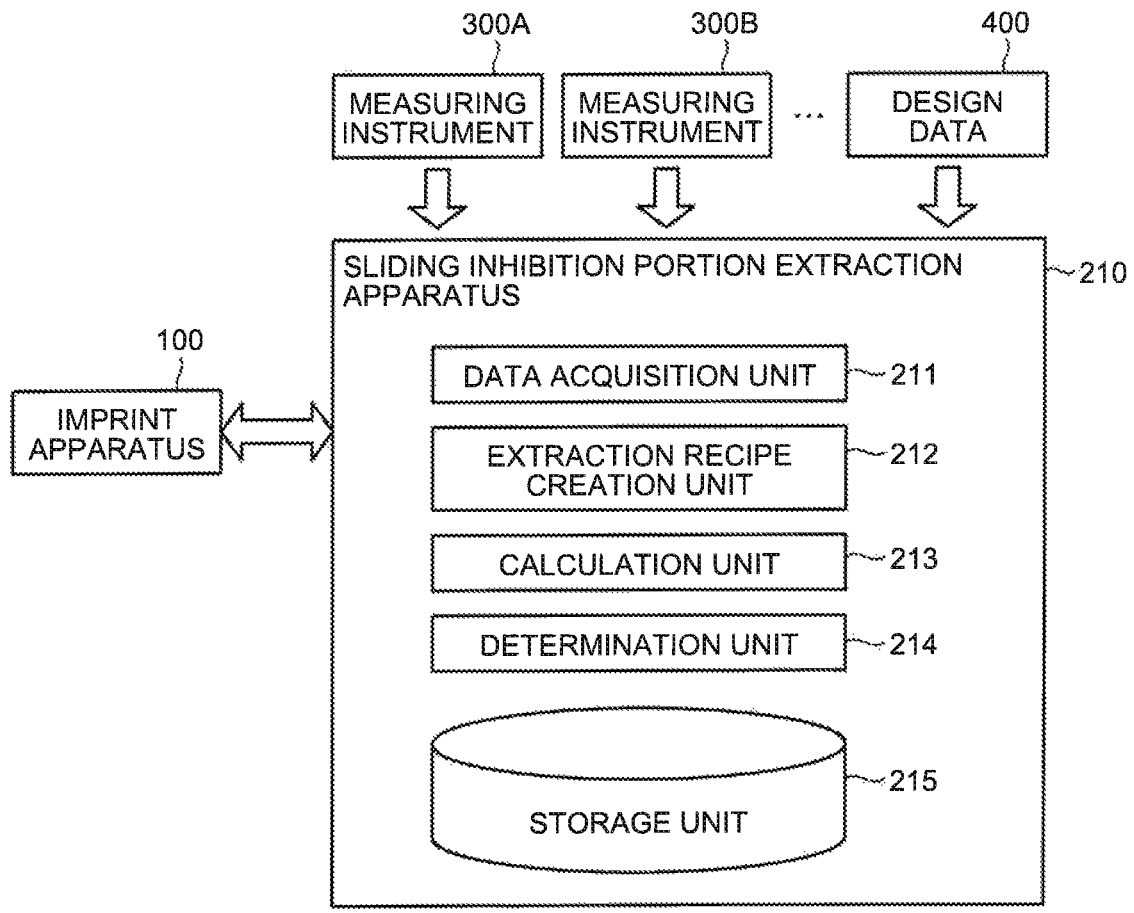
FIG. 6 is a block diagram illustrating an example or a software configuration of the sliding inhibition portion extraction apparatus according to the first embodiment.

FIG. 6 is a block diagram illustrating an example of a software configuration of the sliding inhibition portion extraction apparatus 210 according to the first embodiment.

As illustrated in FIG. 6, the imprint apparatuses 100 is connected to the sliding inhibition portion extraction apparatus 210 to communicate with each other. The sliding inhibition portion extraction apparatus 210 exchanges imprint processing conditions of the wafer W and the like with the imprint apparatus 100.

The sliding inhibition portion extraction apparatus 210 is connected with various measuring instruments 300A, 300B, and the like in a manner of capable of receiving measurement information from the measuring instruments 300A, 300B, and the like. In addition, the sliding inhibition portion extraction apparatus 210 is capable of receiving design data 400. The design data 400 includes information of a pattern layout of the predetermined template 10, and the like.

The sliding inhibition portion extraction apparatus 210 includes, as module configurations to realize functions of the sliding inhibition portion extraction apparatus 210, a data acquisition unit 211, an extraction recipe creation unit 212, a calculation unit 213, a determination unit 214, and a storage unit 215. The module configurations may be realized by the CPU 201 executing a program or may be realized by a dedicated hardware circuit. Further, the storage unit 215 may be realized by an HDD or the like.

The data acquisition unit 211 acquires data such as the imprint processing conditions from the imprint apparatus 100. The imprint processing conditions include a pressing force and a pressing speed of the template 10 when the template 10 is pressed against the wafer W, a distance between the template 10 and the wafer W, and the dropping position and the number of droplets of the resist R. The dropping position and the number of droplets of the resist R are managed by a recipe called drop recipe. The imprint apparatus 100 drops the resist R at a predetermined dropping position and a predetermined number of droplets according to the drop recipe.

The data acquisition unit 211 also acquires various measurement results such as the overlay error from the measuring instruments 300A, 300B, and the like. The overlay error is data of misalignment of the transfer pattern measured after the imprint processing for the wafer W.

The data acquisition unit 211 also acquires the design data 400 such as a pattern layout of the fine pattern 13 to be transferred on the wafer W.

The extraction recipe creation unit 212 creates the drop recipe for extracting the sliding inhibition portion. The sliding inhibition of the template 10 is alleviated by increasing the number of droplets of the resist R to be dropped onto the wafer W to make the arrangement dense. The extraction recipe creation unit 212 creates an extraction recipe set that is a set of a plurality of drop recipes in which the arrangement and the number of droplets of the resist R are variously changed. The created extraction recipe set is transmitted to the imprint apparatus 100. Then, the imprint apparatus 100 actually performs the imprint processing for the wafer W using the extraction recipe set and the imprint apparatus 100 determines whether the sliding inhibition is alleviated, thereby to extract and identify the sliding inhibition portion.

The calculation unit 213 extracts the sliding inhibition portion as an extraction result of a first stage on the basis of data such as the pattern layout acquired by the data acquisition unit 211. The sliding inhibition portion extracted in the first stage is merely based on estimation and cannot be said to be an accurate extraction result. The extracted sliding inhibition portion is referred to when the extraction recipe creation unit 212 creates the extraction recipe set.

The calculation unit 213 also extracts the sliding inhibition portion as an extraction result of a second stage from the result of the imprint processing based on the extraction recipe set. The sliding inhibition portion extracted in the second stage has high accuracy and can be said to be an extraction result with high reliability. The imprint apparatus 100 actually performs the imprint processing for the wafer W under a condition to alleviate the sliding inhibition on the basis of this extraction result and the determines 210 determines whether the sliding inhibition is alleviated, thereby to determine whether the extraction result is correct.

The determination unit 214 determines whether the extraction result of the second stage finally calculated by the calculation unit 213 is correct.

The storage unit 215 stores the various data acquired by the data acquisition unit 211, the extraction recipe set created by the extraction recipe creation unit 212, the extraction result of the sliding inhibition portion by the calculation unit 213, and the like.

(Function Example of Sliding Inhibition Portion Extraction Apparatus)

Figure 7:
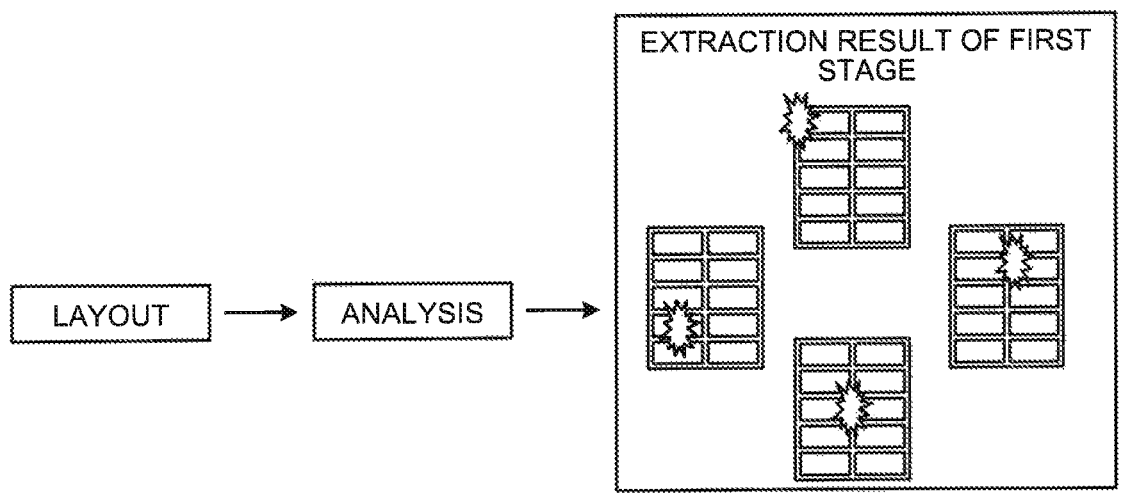
FIG. 7 is a block diagram illustrating a process of deriving an extraction result of a first stage by the sliding inhibition portion extraction apparatus according to the first embodiment.

Next, the functions of the sliding inhibition portion extraction apparatus 210 will be described in more detail using FIG. 7 and FIGS. 8A to 8C. FIG. 7 is a block diagram illustrating a process of deriving the extraction result of the first stage by the sliding inhibition portion extraction apparatus 210 according to the first embodiment.

As illustrated in FIG. 7, the pattern layout is acquired by the data acquisition unit 211. The calculation unit 213 analyzes the pattern layout and extracts the sliding inhibition portion as the extraction result of the first stage. Sparse and dense arrangement of the fine pattern to be transferred and a coverage ratio, and the like are known from the pattern layout, for example. The sliding inhibition portion extracted at this time is a candidate for an assumed sliding inhibition portion, and the number of candidates to be extracted may be one or a plurality of locations.

Figure 8A:
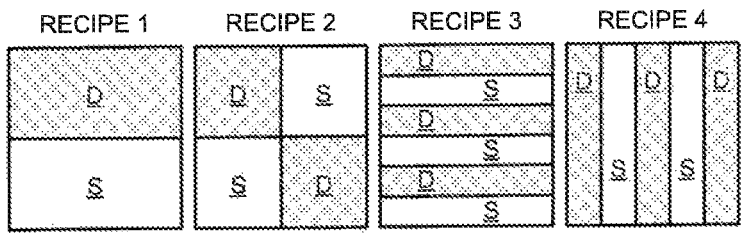
FIG. 8A is a schematic diagram illustrating a process of deriving an extraction result of a second stage by the sliding inhibition portion extraction apparatus according to the first embodiment.
Figure 8B:
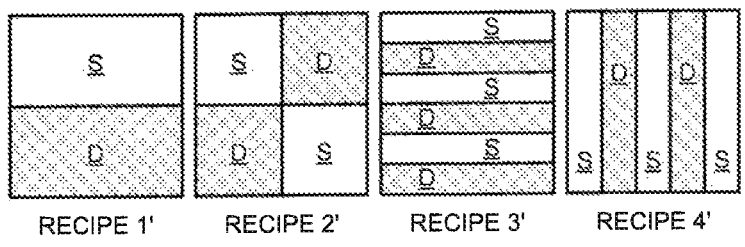
FIG. 8B is a schematic diagram illustrating a process of deriving an extraction result of the second stage by the sliding inhibition portion extraction apparatus according to the first embodiment.
Figure 8C:
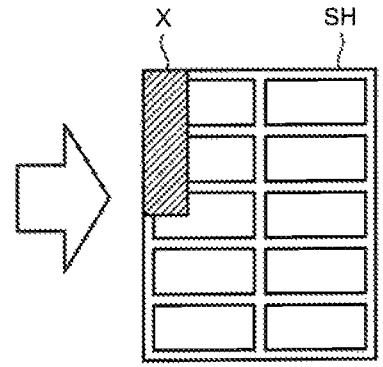
FIG. 8C is a schematic diagram illustrating a process of deriving an extraction result of the second stage by the sliding inhibition portion extraction apparatus according to the first embodiment.

FIGS. 8A to 8C are schematic diagrams illustrating a process of deriving the extraction result of the second stage by the sliding inhibition portion extraction apparatus 210 according to the first embodiment.

As illustrated in FIG. 8A, the extraction recipe creation unit 212 creates the extraction recipe set on the basis of the extraction result of the first stage of the calculation unit 213. The extraction recipe set illustrated in FIG. 8A includes, for example, drop recipes 1 to 4. In the drop recipes 1 to 4, the position of a dense portion D in which the number of droplets of the resist R is increased and the droplets are densely arranged and the position of a normal portion S in which the number of droplets of the resist R is maintained as usual, are variously changed. That is, the dense portion D is thicker in layer thickness of the resist R than the normal portion S.

Next, the imprint processing is performed according to the drop recipes 1 to 4. The data acquisition unit 211 acquires results of the imprint processing. The result of the imprint processing is, for example, the overlay error of the wafer W measured after the imprint processing.

The calculation unit 213 determines which of the drop recipes 1 to 4 is used to generate the sliding inhibition on the basis of the overlay error acquired by the data acquisition unit 213. In other words, a possibility of occurrence of the sliding inhibition is high at the time of use of a drop recipe with a large overlay error. Then, the calculation unit 213 narrows down the sliding inhibition portions in the shot region SH on the basis of the drop recipes in which the sliding inhibition has occurred. That is, for example, when the sliding inhibition occurs in the drop recipe 1, the possibility of occurrence of the sliding inhibition in a region corresponding to the normal portion S of the drop recipe 1 is high. This is because the liquid film of the resist R is thicker in the dense portion D of the drop recipe 1 than usual, and the sliding inhibition is less likely to occur in the dense portion D. If the sliding inhibition occurs even in the drop recipe 2, the sliding inhibition portions are further narrowed down.

Note that, in evaluation using the extraction recipe sets, extraction recipe sets having the dense portion D and the normal portion S inverted from the extraction recipe sets in FIG. 8A are favorably used together. With the inverted extraction recipe sets, the calculation unit 213 can more precisely narrow down the sliding inhibition portions. FIG. 8B illustrates the extraction recipe sets with the inverted dense portions D and normal portions S.

FIG. 8C illustrates a state in which a sliding inhibition portion x in the shot region SH is extracted by the calculation unit 213, using the extraction recipe sets in FIGS. 8A and 8B. In the example of FIG. 8C, a result that the extracted sliding inhibition portion X is an upper right portion of the in-shot region SH is illustrated When a second extraction result is calculated by the calculation unit 213, the imprint processing is performed again under a condition to alleviate the sliding inhibition of the sliding inhibition portion indicated by the extraction result. The condition to alleviate the sliding inhibition is a condition to add the droplets of the resist R to the sliding inhibition portion indicated by the extraction result, for example. The data acquisition unit 211 acquires a result such as the overlay error after the imprint processing.

The determination unit 214 determines whether the second extraction result by the calculation unit 213 is correct from the overlay error or the like acquired by the data acquisition unit 211. That is, if the overlay error is small, it can be said that the second extraction result is correct.

(Example of Sliding Inhibition Portion Extracting Processing)

Next, with reference to FIG. 9, an example of the sliding inhibition portion extracting processing by the sliding inhibition portion extraction apparatus 210 will be described. FIG. 9 is a flowchart illustrating an example of a procedure of the sliding inhibition portion extracting processing by the sliding inhibition portion extraction apparatus 210 according to the first embodiment.

As illustrated in FIG. 9, the data acquisition unit 211 acquires the pattern layout, and the like as initial data (step S11). The calculation unit 213 extracts the sliding inhibition portions assumed from the data as the extraction result of the first stage (step S12). The extraction recipe creation unit 212 creates the extraction recipe sets for the sliding inhibition portions on the basis of the extraction result of the first stage by the calculation unit 213 (step S13).

The data acquisition unit 211 acquires data such as the overlay error of the wafer W that has undergone the imprint processing using the extraction recipe sets as an evaluation result of the extraction recipe sets (step S14). The calculation unit 213 narrows down the sliding inhibition portions in the shot region SH from the evaluation result of the extraction recipe sets and extracts the sliding inhibition portion as the extraction result of the second stage (step S15).

The data acquisition unit 211 acquires data such as the overlay error by the imprint processing under the condition to alleviate the sliding inhibition of the sliding inhibition portion indicated by the extraction result of the second stage (step S16). The determination unit 214 determines whether the sliding Inhibition has been alleviated from the data such as the overlay error (step S17). When the sliding inhibition has not been alleviated (step S17: No), the determination unit 214 determines that the extraction result of the second stage is wrong and returns to step S12. When the sliding inhibition is alleviated (step S17: Yes), the determination unit 214 determines that the extraction result of the second stage is correct and terminates the processing.

The sliding inhibition portion extracting processing by the sliding inhibition portion extraction apparatus 210 is terminated.

Comparative Example

As described above, when the sliding inhibition occurs at the time of alignment between the wafer and the template, it is desirable to immediately identify the sliding inhibition portion and take countermeasures. However, specification of the sliding inhibition portion has been difficult.

As a technique of identifying a sliding inhibition portion of a comparative example, specifying a level difference portion of the wafer W where sliding inhibition is more likely to occur is conceivable, for example. As data indicating arrangement of a level difference in a wafer surface, there is a level difference map measured by a predetermined measuring instrument. However, although the level difference in a wafer can be roughly known by the level difference map, enough precision to specify the sliding inhibition portion cannot be obtained. Although there is a technique of measuring unevenness of a wafer in more detail, the technique requires several days for measurement and is thus not realistic when considering breakdown into a production line.

Variously changing processing conditions of the imprinting processing without specifying the sliding inhibition portion and alleviate the sliding inhibition is conceivable, but several kinds of randomly changed processing conditions need to be evaluated, which takes time, too.

According to the sliding inhibition portion extracting processing of the first embodiment, the sliding inhibition portion can be extracted through the predetermined process. As a result, extraction of the sliding inhibition portion can be made to a routine, and the problem can be solved in a relatively short time with eliminating waste. Further, even an inexperienced operator or the like can easily proceed with work. Further, the overlay error can be more reliably decreased and a yield in the manufacturing processing can be improved with the facilitation of the extraction of the sliding inhibition portion.

According to the sliding inhibition portion extracting processing of the first embodiment, the extraction of the sliding inhibition portion is easy and highly accurate. Therefore, the extraction can be performed for each shot region or each wafer W. As a result, more thorough handling can be performed, and the yield in the manufacturing process can be improved.

Modification

Next, sliding inhibition portion extracting processing according to a modification of the first embodiment will be described with reference to FIG. 10. FIG. 10 is a block diagram illustrating a process of deriving an extraction result of a first stage by a sliding inhibition portion extraction apparatus according to a modification of the first embodiment; A sliding inhibition portion extraction apparatus of the modification is different from the first embodiment in using not only a pattern layout but also a level difference map and a measurement result of an overlay error as initial data.

As illustrated in FIG. 10, a data acquisition unit of the modification acquires the pattern layout, the level difference map, the overlay error, and the like as the initial data. The level difference map is measurement data indicating arrangement of a level difference in a wafer surface that is a transferred object, and is measured before imprint processing. The overlay error is obtained by measuring a wafer after the imprint processing as described above.

A calculation unit of the modification analyzes the initial data and extracts a sliding inhibition portion as an extraction result of a first stage. As described above, there is a strong correlation between occurrence of the sliding inhibition and the overlay error. The calculation unit of the modification can estimate an occurrence state of the slicing inhibition and the like from the overlay error. Further, the calculation unit can estimate the occurrence state of the sliding inhibition from the level difference map. The relationship between the level difference map and the sliding inhibition is illustrated in FIGS. 11A to 11C and FIGS. 12A to 12C.

FIGS. 11A to 11C and FIGS. 12A to 12C are schematic diagrams illustrating the relationship between the level difference map and the sliding inhibition used in the sliding inhibition portion extraction apparatus according to the modification of the first embodiment.

As illustrated in FIG. 11A, the level difference map is provided as a graph of wafer surface height on wafer coordinates, for example. According to the level difference map in FIG. 11A, a wafer W to be measured has a level difference in which relatively narrow recesses and relatively wide protrusions are alternately arranged. FIG. 11B illustrates an uneven state of the wafer W as seen from the level difference map in FIG. 11A.

As illustrated in FIG. 11B, in the wafer W having the level difference map in FIG. 11A, a template 10 and the wafer W are in contact in a relatively wide area. In such a case, a shearing force between the template 10 and the wafer W is dispersed. Therefore, it is expected that the sliding inhibition is relatively less likely to occur.

As illustrated in FIG. 11C, in the wafer W having the level difference map in FIG. 11A, it is expected that a chip region CH in a shot region SH protrudes and a peripheral region Per is recessed.

Figure 12A:
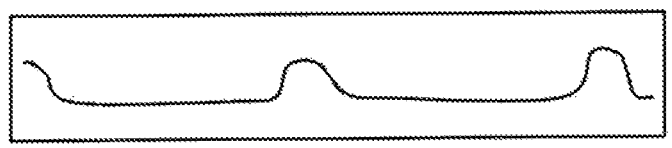
FIG. 12A is a schematic diagram illustrating a relationship between a level difference map and sliding inhibition used in the sliding inhibition portion extraction apparatus according to the modification of the first embodiment.
Figure 12B:
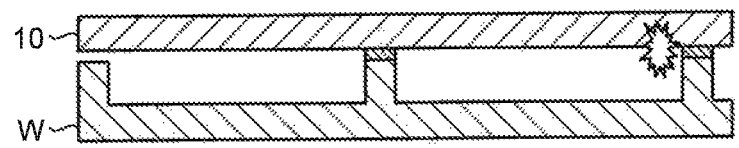
FIG. 12B is a schematic diagram illustrating the relationship between a level difference map and sliding inhibition used in the sliding inhibition portion extraction apparatus according to the modification of the first embodiment.

The wafer W illustrated in FIG. 12A has a level difference map different from the level difference map of the wafer W in FIGS. 11A to 11C. According to the level, difference map in FIG. 12A, the wafer W to be measured has a level difference in which relatively wide recesses and relatively narrow protrusions are alternately arranged. FIG. 12B illustrates an uneven state of the wafer w as seen from the level difference map in FIG. 12A.

As illustrated in FIG. 12B, in the wafer W having the level, difference map in FIG. 12A, the template 10 and the wafer W are in contact only in a relatively narrow area. In such a case, the shearing force between the template 10 and the wafer W is concentrated on a narrow area. Therefore, it is expected that the sliding inhibition is relatively likely to occur.

Figure 12C:
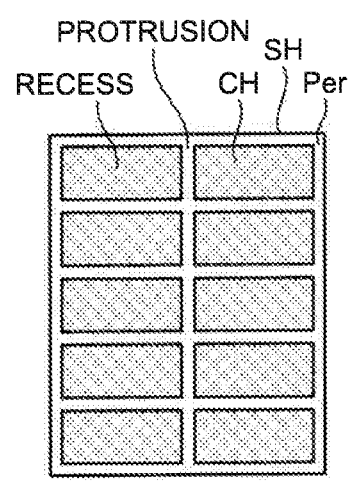
FIG. 12C is a schematic diagram illustrating the relationship between a level difference map and sliding inhibition used in the sliding inhibition portion extraction apparatus according to the modification of the first embodiment.

As illustrated in FIG. 12C, in the wafer W having the level difference map in FIG. 12A, it is expected that the chip region CH in the shot region SH is recessed and the peripheral region Per protrudes.

According to the sliding inhibition portion extracting processing of the modification, the data of the level difference map and the overlay error are analyzed as the initial data, and the sliding inhibition portion is extracted. As a result, the sliding inhibition portion can be estimated with relatively high precision even with the extraction result of the first stage. Therefore, a more appropriate extraction recipe set can be created, and extraction of the sliding inhibition portion is further facilitated.

Second Embodiment

A second embodiment will be described with reference to FIGS. 13 to 16. A sliding inhibition portion extraction apparatus 220 of the second embodiment is different from the sliding inhibition portion extraction apparatus of the first embodiment in using a structure analysis table for extraction of a sliding inhibition portion.

Figure 13:
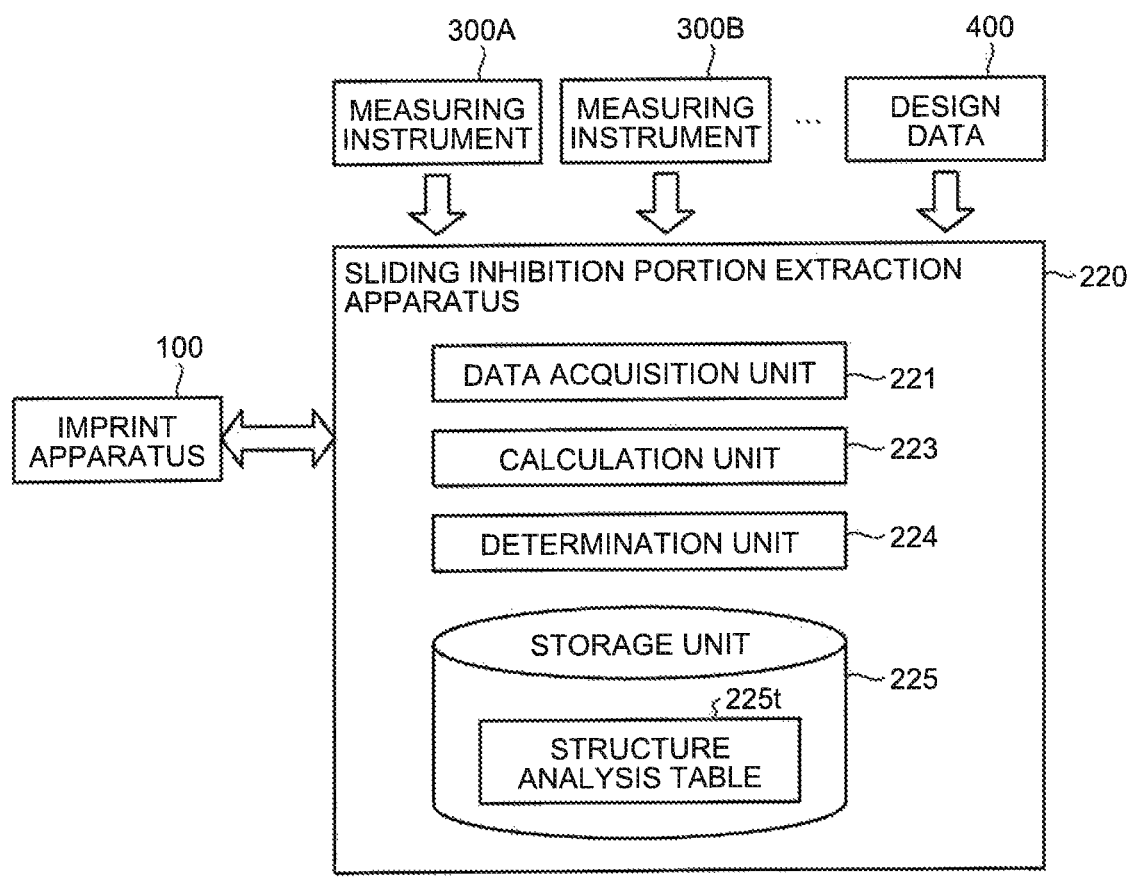
FIG. 13 is a block diagram illustrating an example of a software configuration of the sliding inhibition portion extraction apparatus according to a second embodiment.

FIG. 13 is a block diagram illustrating an example of a software configuration of the sliding inhibition portion extraction apparatus 220 according to the second embodiment.

As illustrated in FIG. 13, the sliding inhibition portion extraction apparatus 220 includes, as module configurations to realize functions of the sliding inhibition portion extraction apparatus 220, a data acquisition unit 221, a calculation unit 223, a determination unit 224, and a storage unit 225. In the sliding inhibition portion extraction apparatus 220, creation of extraction recipe sets is not performed.

The data acquisition unit 221 acquires data such as imprint processing conditions from an imprint apparatus 100. The data acquisition unit 211 also acquires various measurement results such as the level difference map and the overlay error from measuring instruments 300A, 300B, and the like. The data acquisition unit 221 also acquires design data 400 such as a pattern layout of a fine pattern to be transferred on the wafer.

The calculation unit 223 extracts the sliding inhibition portion on the basis of the data such as the pattern layout, the level difference map, and the overlay error acquired by the data acquisition unit 221. At this time, the calculation unit 223 refers to a structure analysis table 225t stored in the storage unit 225. The structure analysis table 225t is a data table in which a distribution in a shot region of the sliding inhibition portion is associated with the overlay error. By referring to the structure analysis table 225t, the extracted sliding inhibition portion is highly accurate and is a reliable extraction result. The imprint apparatus 100 actually performs imprint processing for the wafer under a condition to alleviate sliding inhibition on the basis of this extraction result and the sliding inhibition portion extraction apparatus 220 determines whether the sliding inhibition is alleviated, thereby to determine whether the extraction result is correct.

The determination unit 224 determines whether the extraction result calculated by the calculation unit 223 is correct.

The storage unit 225 stores the various data acquired by the data acquisition unit 221, the extraction result of the sliding inhibition portion by the calculation unit 223, the structure analysis table 225t, and the like.

Figure 14:
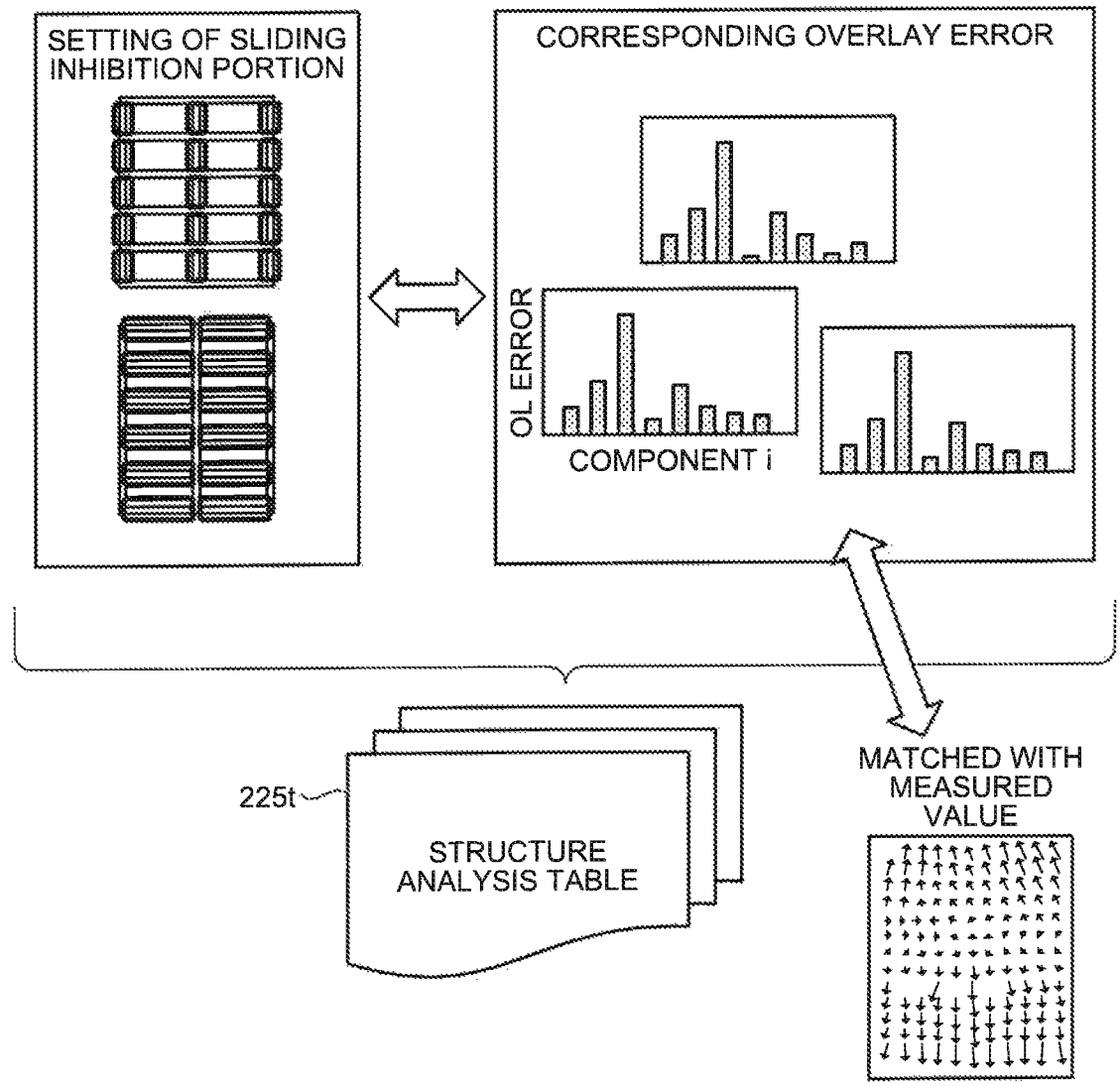
FIG. 14 is a schematic diagram for describing a structure analysis table included in a sliding inhibition portion extraction apparatus according to a second embodiment.

FIG. 14 is a schematic diagram for describing the structure analysis table 225t included in the sliding inhibition portion extraction apparatus 220 according to the second embodiment.

As illustrated in FIG. 14, the structure analysis table 225t illustrates a correlation between the sliding inhibition portion and the overlay error. The data in the structure analysis table 225t is based on a simulation result. That is, several sliding inhibition portions are set within the shot region, and simulation as to what kind of overlay error is obtained where the sliding inhibition occurs in the shot region is performed. The overlay error is obtained such that, a misalignment direction of a transfer pattern is decomposed into a plurality of components i including an X direction and a Y direction, and is illustrated as a misalignment amount in each direction. It has been confirmed that such a simulation result matches a result in the actual wafer W.

The calculation unit 223 refers to such a structure analysis table 225t and analyzes the overlay error from among the data obtained as the initial data, thereby to estimate the sliding inhibition portion in the shot region.

Figure 15:
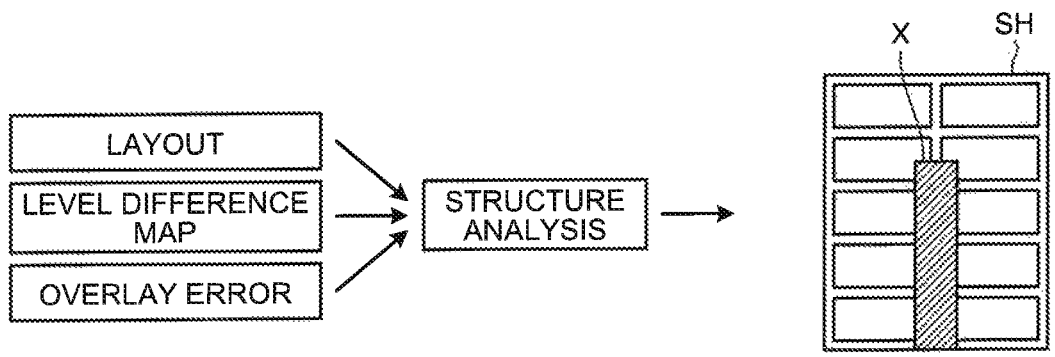
FIG. 15 is a block diagram illustrating a process of deriving an extraction result of a sliding inhibition portion by the sliding inhibition portion extraction apparatus according to the second embodiment.

FIG. 15 is a block diagram illustrating a process of deriving an extraction result of the sliding inhibition portion by the sliding inhibition portion extraction apparatus 220 according to the second embodiment.

As illustrated in FIG. 15, the data acquisition unit 221 acquires the pattern layout, the level difference map, and the overlay error. The calculation unit 223 analyzes these data by referring to the structure analysis table 225t and extracts the sliding inhibition portion. The sliding inhibition portion at this time is extracted not as a candidate but as a definitive result. Note that one or a plurality of the sliding inhibition portions may be extracted as long as the sliding inhibition portions are definitive. In the example of FIG. 15, a result that an extracted sliding inhibition portion X is a lower central portion of the in-shot region SH is illustrated.

Next, the imprint processing is performed under the condition to alleviate the sliding inhibition of the sliding inhibition portion indicated by the extraction result. The data acquisition unit 221 acquires a result of the overlay error and the like after the imprint processing. The determination unit 224 determines whether the extraction result by the calculation unit 223 is correct from the overlay error and the like acquired by the data acquisition unit 221.

Figure 16:
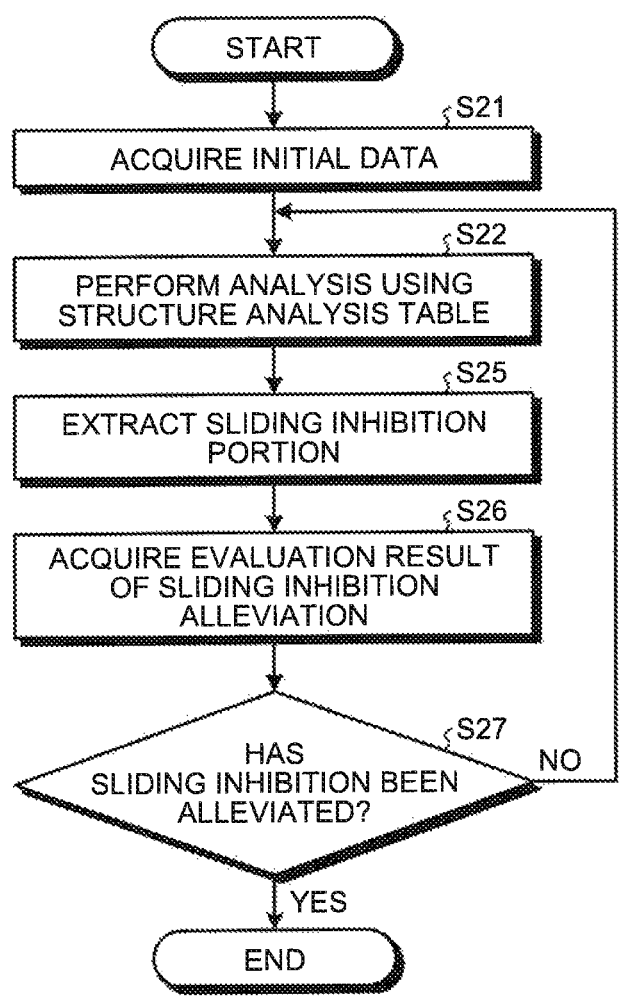
FIG. 16 is a flowchart illustrating an example of a procedure of sliding inhibition portion extracting processing by the sliding inhibition portion extraction apparatus according to the second embodiment.

FIG. 16 is a flowchart illustrating an example of a procedure of sliding inhibition portion extracting processing by the sliding inhibition portion extraction apparatus 220 according to the second embodiment.

As illustrated in FIG. 16, the data acquisition unit 221 acquires the pattern layout, the level difference map, the overlay error, and the like as initial data (step S21). The calculation unit 223 analyzes the data using the structure analysis table 225t (step S22). The calculation unit 223 extracts the sliding inhibition portion on the basis of the analysis result (step S25).

The data acquisition unit 221 acquires the data such as the overlay error by the imprint processing under the condition to alleviate the sliding inhibition of the sliding inhibition portion indicated by the extraction result by the calculation unit 223 (step S26). The determination unit 224 determines whether the sliding inhibition has been alleviated from the data such as the overlay error (step S27). When the sliding inhibition has not been alleviated (step S27: No), the determination unit 224 determines that the extraction result by the calculation unit 223 is wrong and returns to step S22. When the sliding inhibition is alleviated (step S27: Yes), the determination unit 224 determines that the extraction result by the calculation unit 223 is correct and terminates the processing.

The sliding inhibition portion extracting processing by the sliding inhibition portion extraction apparatus 220 is terminated.

According to the sliding inhibition portion extracting processing of the second embodiment, the calculation unit. 223 analyzes the data using the structure analysis table 225t. Thereby, the accuracy of the extraction result derived by the calculation unit 223 becomes high and the reliability is improved. Therefore, it is not necessary to narrow down candidates, using extraction recipe sets, and the problem can be solved in a shorter time.

As described above, according to the sliding inhibition portion extracting processing of the first and second embodiments, the sliding inhibition portion is extracted with high accuracy. An operator can take measures to alleviate the sliding inhibition on the basis of the processing. Several techniques are considered to alleviate the sliding inhibition.

Third Embodiment

A third embodiment will be described with reference to FIGS. 17A to 17C to FIGS. 21A to 21C. In the third embodiment, several examples of the technique of alleviating the sliding inhibition of the sliding inhibited portion extracted in the first and second embodiments will be described.

(First Alleviating Technique)

FIGS. 17A and 17B, and FIGS. 18A and 18B are schematic diagrams for describing a first alleviating technique of sliding inhibition according to the third embodiment.

Figure 17A:
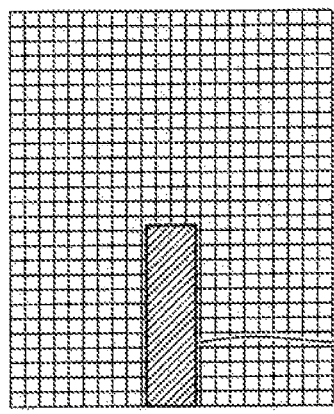
FIG. 17A is a schematic diagram for describing a first alleviating technique of sliding inhibition according to a third embodiment.
Figure 17B:
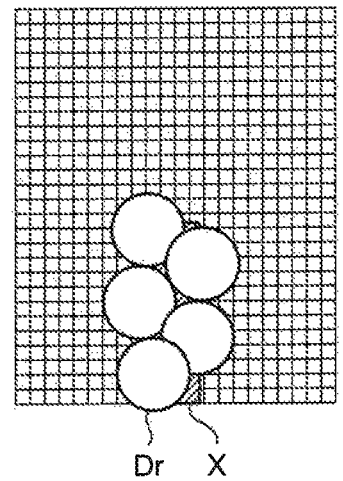
FIG. 17B is a schematic diagram for describing the first alleviating technique of sliding inhibition according to the third embodiment.

As illustrated in FIG. 17A, in the present example, an extracted sliding inhibition portion X is located in a lower central portion of a shot region, for example. In the first alleviating technique of sliding inhibition, droplets Dr of a resist are added to the extracted sliding inhibition portion X and a vicinity of the sliding inhibition portion X, as illustrated in FIG. 17B. It is considered that, in the sliding inhibition portion X, a wafer and a template are close to each other due to existence of a protrusion of the water, and a liquid film of the resist is thin. By adding the droplets Dr of the resist to make the liquid film of the resist thick, and the sliding inhibition is supposed to be able to be alleviated.

Figure 18A:
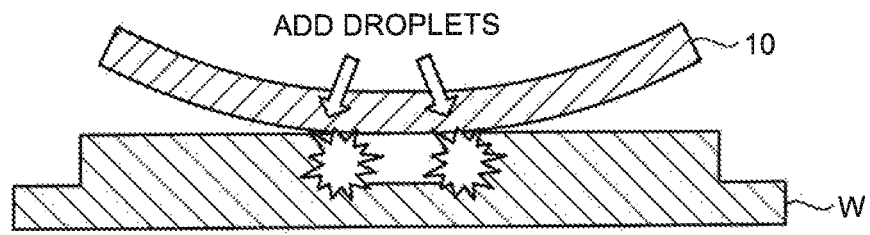
FIG. 18A is a schematic diagram for describing the first alleviating technique of sliding inhibition according to the third embodiment.
Figure 18B:
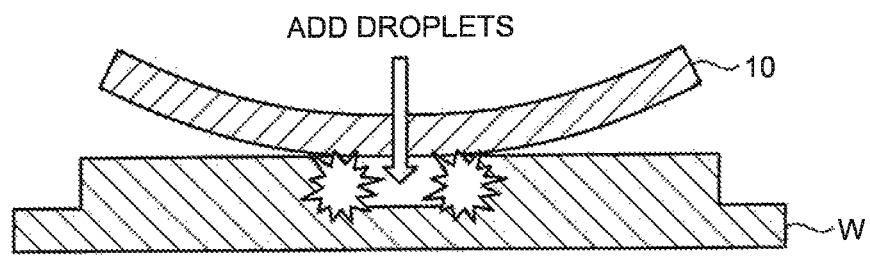
FIG. 18B is a schematic diagram for describing the first alleviating technique of sliding inhibition according to the third embodiment.

Two techniques are conceivable in adding the droplets Dr of the resist. The two techniques are illustrated in FIGS. 18A and 18B. FIG. 18A illustrates a technique of adding the droplets Dr to the protrusion as the sliding inhibition portion as is. By the technique, the liquid film of the resist in the sliding inhibition portion becomes thick and the sliding inhibition is alleviated. FIG. 18B illustrates a technique of adding the droplets Dr with a volume that fills the recess sandwiched by the protrusions as the sliding inhibition portions. By the technique, the liquid film of the resist in the recess is raised, and the sliding inhibition is alleviated.

Such addition of the droplets Dr can be performed by rearranging drop recipes. In rearranging the drop recipes, the condition may just be changed in a direction of increasing a residual layer thickness of the resist. Here, the residual layer thickness of the resist will be described with reference to FIGS. 19A1, 19A2, 19B1, and 19B2.

FIGS. 19A1, 19A2, 19B1, and 19B2 are schematic diagrams for describing the influence of the first alleviating technique of sliding inhibition according to the third embodiment on the residual layer thickness of the resist. As illustrated in FIGS. 19A1 and 19A2, when a fine pattern 13 of a template 10 is pressed against a wafer W, the wafer W and the template 10 are arranged with a predetermined distance so as not to come into contact with each other. The liquid film of a resist R extends and spreads between the wafer W and the template 10, and becomes to have a thickness LF' or LF equal, to the distance between the wafer W and the template 10.

As illustrated in FIGS. 19B1 and 19B2, when the resist R is cured and a transfer pattern 13t' or 13t is formed, the thickness LF' or LF of the liquid film of the resist R becomes a residual layer thickness RLT' or RLT between the transfer patterns 13t' or 13t.

Here, FIGS. 19A1 and 19B1 illustrate a state before drop recipe change, that is, a state before addition of the droplets Dr of the resist R. FIGS. 19A2 and 19B2 illustrate a state after drop recipe change, that is, a state after addition of the droplets Dr of the resist R.

As illustrated in FIGS. 19A1 and 19A2, by adding the droplets Dr, the thickness LF of the liquid film of the resist R becomes thicker than the thickness LF' of the liquid film of the resist R before addition of the droplets Dr. This is the ground for alleviation of the sliding inhibition being expected.

As illustrated in FIGS. 19B1 and 19B2, by adding the droplets Dr, the residual layer thickness RLT after curing the resist becomes thicker than the residual layer thickness RLT' before addition of the droplets Dr. It should be noted that the addition of the droplets Dr affects the residual layer thickness RLT.

(Second Alleviating Technique)

Figure 20A:
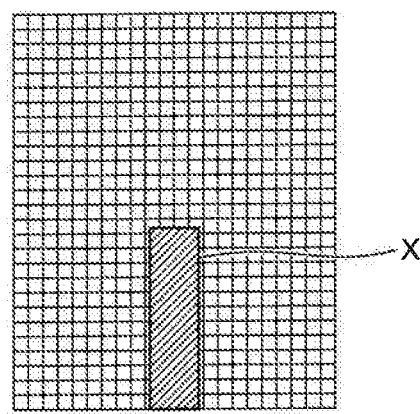
FIG. 20A is a schematic diagram for describing a second alleviating technique of sliding inhibition according to the third embodiment.
Figure 20B:
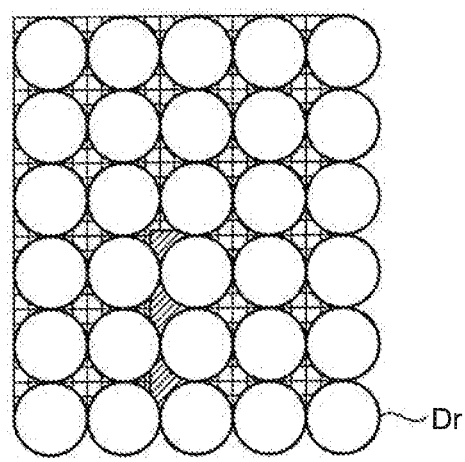
FIG. 20B is a schematic diagram for describing the second alleviating technique of sliding inhibition according to the third embodiment.
Figure 20C:
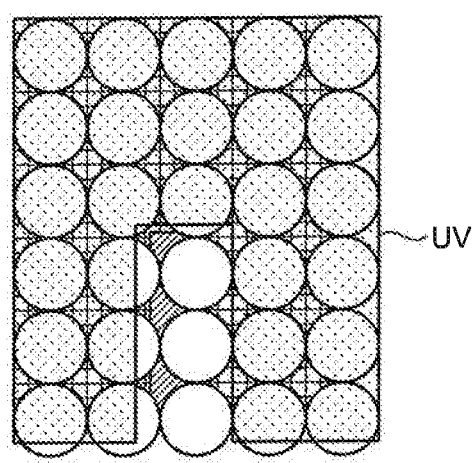
FIG. 20C is a schematic diagram for describing the second alleviating technique of sliding inhibition according to the third embodiment.

FIGS. 20A to 20C are schematic diagrams for describing a second alleviating technique of sliding inhibition according to the third embodiment.

As illustrated in FIG. 20A, in the present example, the extracted sliding inhibition portion X is located in a lower central portion of a shot region, for example. In the second alleviating technique of sliding inhibition, the droplets Dr are added not only to the extracted sliding inhibition portion X but also to the entire shot region, as illustrated in FIG. 20B. Then, as illustrated in FIG. 20C, a region other than the sliding inhibition portion X is irradiated with an ultraviolet rays UV to semi-cure the resist. The semi-curing of the resist is to increase the viscosity of the resist and to prevent the resist from completely solidifying by applying the ultraviolet rays UV with weakened intensity. To irradiate the region other than the sliding inhibition portion X with the ultraviolet rays UV, a digital mirror device (DMD) or the like is arranged in an optical path of the ultraviolet rays UV, and an intensity distribution in an irradiation plane is caused for the ultraviolet rays UV by the DMD.

The second alleviating technique of sliding inhibition is effective in a case where the droplets Dr flow out even if the droplets Dr are directly added to the sliding inhibition portion X, such as a case where the sliding inhibition portion X corresponds to a corner of a protrusion of the wafer. If the droplets Dr are simply added to the entire shot region, the template becomes too smooth in the region other than the sliding inhibition portion X, and precise alignment may not be able to be performed. By semi-curing the resist, to increase the viscosity in the region other than the sliding inhibition portion X as in the second alleviating technique of sliding inhibition, such excessive smoothness can be suppressed.

(Third Alleviating Technique)

Figure 21A:
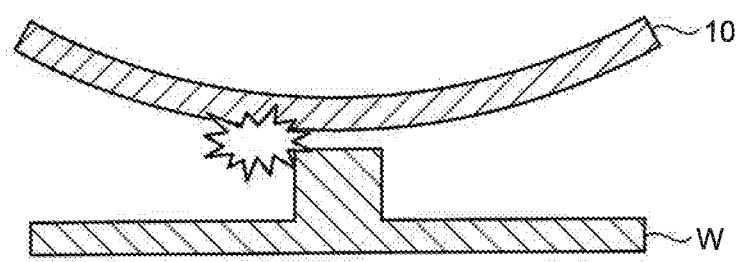
FIG. 21A is a schematic diagram for describing a third alleviating technique of sliding inhibition according to the third embodiment.
Figure 21B:
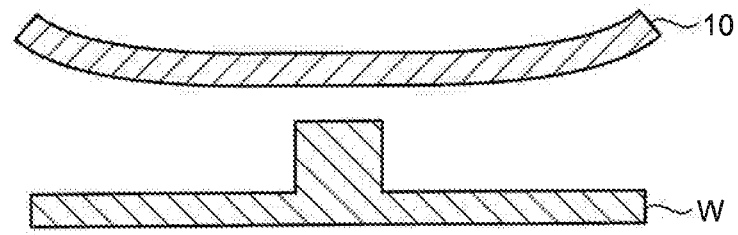
FIG. 21B is a schematic diagram for describing the third alleviating technique of sliding inhibition according to the third embodiment.
Figure 21C:
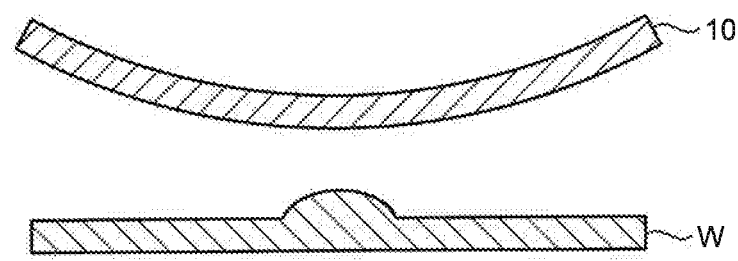
FIG. 21C is a schematic diagram for describing the third alleviating technique of sliding inhibition according to the third embodiment.

FIGS. 21A to 21C are schematic diagrams for describing a third alleviating technique of sliding inhibition according to the third embodiment.

As illustrated in FIG. 21A, in the present example, the extracted sliding inhibition portion X is a predetermined protrusion on the wafer W. In the third alleviating technique of sliding inhibition, a distance between the protrusion of the wafer W and the template 10 is provided so that the protrusion of the wafer W and the template 10 do not come into contact, with each other. Several techniques are conceivable for providing the distance.

As illustrated in FIG. 21B, as a simple technique of taking the distance between the protrusion of the wafer W and the template 10, the distance between the wafer W and the template 10 is increased. To increase the distance between the wafer W and the template 10, a pressing force applied to the template 10 may be decreased, for example.

As illustrated in FIG. 21C, as another technique of providing the distance between the protrusion of the wafer W and the template 10, the protrusion on the wafer W is scraped. The protrusion can be scraped by, for example, etching back. Further, in a case where the protrusion is an isolated pattern or the like, the protrusion may be polished by a chemical mechanical polishing (CMP) method.

The above first to third alleviating techniques of sliding inhibition can be applied to finding the imprint processing conditions in a development stage. Further, the above first to third alleviating techniques of sliding inhibition can be applied to a technique of decreasing variation within a wafer, variation between wafers, variation between lots, and the like in the manufacturing process or the like.

According to the alleviating technique of sliding inhibition of the third embodiment, measures are taken on the basis of the extraction result with high accuracy of the sliding inhibition portion. Therefore, the problem can be solved in a relatively short time with eliminating waste. In addition, the overlay error can be more reliably decreased, and the yield in the manufacturing process can be improved.

According to the alleviating technique of sliding inhibition of the third embodiment, the measures can be taken against the sliding inhibition portion extracted for each shot region or for each wafer W. As a result, more thorough handling can be performed, and the yield in the manufacturing process can be improved.

Other Embodiments

In the above-described first to third embodiments and the like, the imprint apparatus 100 is configured to drop the resist R. However, an embodiment is not limited to the configuration. The above-described first, to third embodiments and the like can be applied to spin coat imprint processing of applying a resist to an entire surface of a wafer by a spin coat application method.

In the above-described first to third embodiments and the like, the imprint processing from the template 10 to the wafer W has been described. However, an embodiment is not limited to the processing. The above-described first, to third embodiments and the like can be applied to a manufacturing process of a replica template that is a template with a pattern to be transferred to a wafer. That is, the above-described first to third embodiments and the like can be applied to imprint processing from a master template to a replica template.

In the above-described first to third embodiments and the like, the imprint processing from the flat plate like template 10 to the flat plate like wafer W has been described. However, an embodiment is not limited to the processing. The above-described first to third embodiments and the like can be applied to roll-to-roll imprint processing in imprint processing is performed from a roll original to a film transferred object.

The above-described first to third embodiments and the like can be applied to any processing as long as the processing is imprinting processing of transferring a fine pattern on a transferred object, in addition to the above processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sliding inhibition portion extracting method applied to pattern formation to press an original having a pattern against a resin on a transferred object and cure the resin to transfer the pattern of the original, the method comprising:

extracting a sliding inhibition portion that inhibits sliding of the original in a state of being in contact with the resin before curing in a shot region that is a region in which the pattern is formed by single transfer by either a first technique of estimating the sliding inhibition portion on the basis of at least one of an uneven distribution on a surface of the transferred object, a pattern layout of the original, and a result of misalignment of a transfer pattern, changing a thickness of the resin in the shot region on the basis of the estimation, and determining whether sliding inhibition of the original occurs, or a second technique using a table indicating a relationship between a distribution of the sliding inhibition portion in the shot region and the misalignment of a transfer pattern.

2. The sliding inhibition portion extracting method according to claim 1, further comprising:

in the first technique, estimating the sliding inhibition portion on the basis of a ratio of areas between a recess and a protrusion from the uneven distribution on a surface of the transferred object;

estimating the sliding inhibition portion on the basis of at least, either sparse and dense arrangement of the pattern or a coverage ratio of the pattern from the pattern layout of the original; or estimating the sliding inhibition portion on the basis of magnitude of the misalignment of the transfer pattern from the result of the misalignment, of the transfer pattern.

3. The sliding inhibition portion extracting method according to claim 1, further comprising:

in the first technique, estimating that a portion in which an area of a protrusion is larger than an area of a recess has a high possibility of being the sliding inhibition portion from the uneven distribution on a surface of the transferred object;

estimating that a portion in which the pattern is sparse or a coverage ratio of the pattern is small has a high possibility of being the sliding inhibition portion from the pattern layout of the original; or estimating that a portion having large misalignment of the transfer pattern has a high possibility of being the sliding inhibition portion from the result of the misalignment, of the transfer pattern.

4. The sliding inhibition portion extracting method according to claim 1, further comprising:

in the first technique, determining whether sliding inhibition of the original occurs, using an extraction recipe set in which the thickness of the resin in the shot region is changed.

5. The sliding inhibition portion extracting method according to claim 1, further comprising:

in the first technique, confirming that the sliding inhibition of the original is alleviated by making the resin of the extracted sliding inhibition portion thick.

6. The sliding inhibition portion extracting method according to claim 1, wherein the table used in the second technique is based on simulation of what kind of misalignment is caused where in the shot region the sliding inhibition occurs.

7. The sliding inhibition portion extracting method according to claim 6, wherein, in the simulation, the misalignment of the transfer pattern is obtained as decomposition of a direction of the misalignment into a plurality of components.

8. The sliding inhibition portion extracting method according to claim 1, further comprising:

making the resin of the extracted sliding inhibition portion thick to alleviate the sliding inhibition of the original when the method is applied to the pattern formation.

9. A pattern forming method of pressing an original having a pattern against a resin on a transferred object and curing the resin to transfer the pattern of the original, the method comprising:

extracting a sliding inhibition portion that inhibits sliding of the original in a state of being in contact with the resin before curing in a shot region that is a region in which the pattern is formed by single transfer by either a first technique of estimating the sliding inhibition portion on the basis of at least one of an uneven distribution on a surface of the transferred object, a pattern layout of the original, and a result of misalignment of a transfer pattern, changing a thickness of the resin in the shot region on the basis of the estimation, and determining whether slicing inhibition of the original occurs, or a second technique using a table indicating a relationship between a distribution of the sliding inhibition portion in the shot region and the misalignment of a transfer pattern; and making the resin of the extracted sliding inhibition portion thick to alleviate the sliding inhibition of the original and transferring the pattern on the transferred object.

10. The pattern forming method according to claim 9, further comprising:

in the first technique, estimating the sliding inhibition portion on the basis of a ratio of areas between a recess and a protrusion from the uneven distribution on a surface of the transferred object;

estimating the sliding inhibition portion on the basis of at least either sparse and dense arrangement of the pattern or a coverage ratio of the pattern from the pattern layout of the original; or estimating the sliding inhibition portion on the basis of magnitude of the misalignment of the transfer pattern from the result of the misalignment of the transfer pattern.

11. The pattern forming method according to claim 9, further comprising:

in the first technique, determining whether sliding inhibition of the original occurs, using an extraction recipe set in which the thickness of the resin in the shot region is changed.

12. The pattern forming method according to claim 9, further comprising:

in the first technique, confirming that the sliding inhibition of the original is alleviated by making the resin of the extracted sliding inhibition portion thick.

13. The pattern forming method according to claim 9, wherein the table used in the second technique is based on simulation of what kind of misalignment is caused where in the shot region the sliding inhibition occurs.

14. The pattern forming method according to claim 9, further comprising:

dropping the resin on the transferred object in a state of droplets; and adjusting a dropping position and the number of droplets of the resin to make the resin of the sliding inhibition portion thick.

15. A semiconductor device manufacturing method of pressing an original having a pattern against a resin-based mask material on a semiconductor substrate and curing the resin-based mask material to transfer the pattern of the original, the method comprising:

extracting a sliding inhibition portion that inhibits sliding of the original in a state of being in contact with the resin-based mask material before curing in a shot region that is a region in which the pattern is formed by single transfer by either a first technique of estimating the sliding inhibition portion on the basis of at least one of an uneven distribution on a surface of the semiconductor substrate, a pattern layout of the original, and a result of misalignment of a transfer pattern, changing a thickness of the resin-based mask material in the shot region on the basis of the estimation, and determining whether sliding inhibition of the original occurs, or a second technique using a table indicating a relationship between a distribution of the sliding inhibition portion in the shot region and the misalignment of a transfer pattern; and making the resin-based mask material of the extracted sliding inhibition portion thick to alleviate the sliding inhibition of the original and transferring the pattern on the semiconductor substrate.

16. The semiconductor device manufacturing method according to claim 15, further comprising:

in the first technique, estimating the sliding inhibition portion on the basis of a ratio of areas between a recess and a protrusion from the uneven distribution on a surface of the semiconductor substrate;

estimating the sliding inhibition portion on the basis of at least either sparse and dense arrangement of the pattern or a coverage ratio of the pattern from the pattern layout of the original; or estimating the sliding inhibition portion on the basis of magnitude of the misalignment of the transfer pattern from the result of the misalignment of the transfer pattern.

17. The semiconductor device manufacturing method according to claim 15, further comprising:

in the first technique, determining whether sliding inhibition of the original occurs, using an extraction recipe set in which the thickness of the resin in the shot region is changed.

18. The semiconductor device manufacturing method according to claim 15, further comprising:

in the first technique, confirming that the sliding inhibition of the original is alleviated by making the resin of the extracted sliding inhibition portion thick.

19. The semiconductor device manufacturing method according to claim 15, wherein the table used in the second technique is based on simulation of what kind of misalignment, is caused where in the shot region the sliding inhibition occurs.

20. The semiconductor device manufacturing method according to claim 15, further comprising:

dropping the resin on the semiconductor substrate in state of droplets; and adjusting a dropping position and the number of droplets of the resin to make the resin of the sliding inhibition portion thick.

* * * * *